United States Patent
Matsuyama et al.

(10) Patent No.: US 10,181,514 B2
(45) Date of Patent: Jan. 15, 2019

(54) VERTICAL SEMICONDUCTOR DEVICE AND MANUFACTURING METHOD THEREOF

(71) Applicant: FUJI ELECTRIC CO., LTD., Kanagawa (JP)

(72) Inventors: Hideaki Matsuyama, Hino (JP); Shinya Takashima, Hachioji (JP); Katsunori Ueno, Matsumoto (JP); Takuro Inamoto, Kawasaki (JP); Masaharu Edo, Tokorozawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/719,607

(22) Filed: Sep. 29, 2017

(65) Prior Publication Data

US 2018/0097063 A1 Apr. 5, 2018

(30) Foreign Application Priority Data

Oct. 3, 2016 (JP) .................................. 2016-195648

(51) Int. Cl.
*H01L 29/00* (2006.01)
*H01L 29/10* (2006.01)
(Continued)

(52) U.S. Cl.
CPC ...... *H01L 29/1095* (2013.01); *H01L 21/0254* (2013.01); *H01L 21/26546* (2013.01);
(Continued)

(58) Field of Classification Search
None
See application file for complete search history.

(56) References Cited

U.S. PATENT DOCUMENTS

| 5,917,204 A | 6/1999 | Bhatnagar et al. |
| 2008/0099836 A1 | 5/2008 | Matsuura et al. |

(Continued)

FOREIGN PATENT DOCUMENTS

| JP | H10-284733 A | 10/1998 |
| JP | 2002359378 A | 12/2002 |

(Continued)

OTHER PUBLICATIONS

Office Action issued for counterpart Japanese Application 2016-195648, issued by the Japan Patent Office dated Nov. 30, 2016.

(Continued)

*Primary Examiner* — Reema Patel

(57) ABSTRACT

In a case where a semiconductor layer is epitaxially grown on a step shape formed due to CBL (current blocking layer) formation, the crystallinity of the semiconductor layer lowers. Also, a GaN layer that is epitaxially regrown on the CBL is not formed continuously by epitaxial growth, and therefore the crystallinity of the GaN layer lowers. A vertical semiconductor device manufacturing method is provided that comprises: a step of epitaxially growing a gallium nitride-based n-type semiconductor layer on a gallium nitride-based semiconductor substrate; a step of epitaxially growing a gallium nitride-based p-type semiconductor layer on the n-type semiconductor layer; and a step of ion-implanting p-type impurities to form a $p^+$-type embedded region selectively in a predetermined depth range across the boundary between the n-type semiconductor layer and the p-type semiconductor layer.

6 Claims, 12 Drawing Sheets

(51) Int. Cl.
- *H01L 21/02* (2006.01)
- *H01L 21/265* (2006.01)
- *H01L 29/20* (2006.01)
- *H01L 29/66* (2006.01)
- *H01L 29/78* (2006.01)
- *H01L 29/08* (2006.01)

(52) U.S. Cl.
CPC .... *H01L 29/2003* (2013.01); *H01L 29/66446* (2013.01); *H01L 29/66734* (2013.01); *H01L 29/7813* (2013.01); *H01L 29/0856* (2013.01); *H01L 29/0873* (2013.01)

(56) References Cited

U.S. PATENT DOCUMENTS

| | | |
|---|---|---|
| 2009/0256197 A1 | 10/2009 | Nakazawa et al. |
| 2012/0319127 A1 | 12/2012 | Chowdhury et al. |
| 2013/0146969 A1 | 6/2013 | Fujiwara et al. |
| 2015/0028350 A1 | 1/2015 | Suvorov et al. |
| 2015/0162432 A1* | 6/2015 | Kumagai ............ H01L 29/0684 257/77 |

FOREIGN PATENT DOCUMENTS

| | | |
|---|---|---|
| JP | 2008112890 A | 5/2008 |
| JP | 2009253139 A | 10/2009 |
| JP | 2010263087 A | 11/2010 |
| JP | 2013125763 A | 6/2013 |
| JP | 2014520405 A | 8/2014 |
| JP | 2016115831 A | 6/2016 |
| JP | 2016530712 A | 9/2016 |

OTHER PUBLICATIONS

Notice of Allowance issued for counterpart Japanese Application 2016-195648, issued by the Japan Patent Office dated Feb. 28, 2017.

Srabanti Chowdhury et al., "Enhancement and depletion mode AlGaN/GaN CAVET with Mg-ion-implanted GaN as current blocking layer" IEEE Electron Device Letters, vol. 29, No. 6, Jun. 2008, p. 543-545.

* cited by examiner

VERTICAL SEMICONDUCTOR DEVICE AND MANUFACTURING METHOD THEREOF

The contents of the following Japanese patent application are incorporated herein by reference:
NO. 2016-195648 filed in JP on Oct. 3, 2016.

BACKGROUND

1. Technical Field

The present invention relates to vertical semiconductor devices and manufacturing methods thereof.

2. Related Art

Semiconductor devices formed of GaN (gallium nitride) have higher power conversion efficiency than semiconductor devices formed of Si (silicon). For example, semiconductor devices formed of GaN have lower power loss than semiconductor devices formed of Si and are therefore expected to produce energy saving effect. Conventionally, after a current blocking layer (hereinafter referred to as CBL) is formed, a chemical compound semiconductor layer is epitaxially regrown on the CBL (for example, see Patent Document 1 and Non-Patent Document 1).

PATENT DOCUMENT

Patent Document 1: Japanese Translation Publication No. 2014-520405

NON-PATENT DOCUMENT

Non-Patent Document 1: Srabanti Chowdhury, et al., "Enhancement and Depletion Mode AlGaN/GaN CAVET With Mg-Ion-Implanted GaN as Current Blocking Layer", IEEE Electron Device Letters, June 2008, Vol. 29, No. 6, pp. 543-545

However, in a case where a semiconductor layer is epitaxially grown on a step shape formed due to CBL formation, the crystallinity of the semiconductor layer lowers. Also, even if a CBL having no steps is formed by ion implantation, the GaN layer to be epitaxially regrown on the CBL is not formed continuously by epitaxial growth, and therefore the crystallinity of the GaN layer lowers.

SUMMARY

In a first aspect of the present invention, a vertical semiconductor device manufacturing method is provided. The vertical semiconductor device manufacturing method may include epitaxially growing a gallium nitride-based n-type semiconductor layer, epitaxially growing a gallium nitride-based p-type semiconductor layer, and ion-implanting p-type impurities. The n-type semiconductor layer may be formed on the gallium nitride-based semiconductor substrate. The p-type semiconductor layer may be formed on the n-type semiconductor layer. The p-type impurities may be ion-implanted into a predetermined depth range across the boundary between the n-type semiconductor layer and the p-type semiconductor layer. The p-type impurities may be ion-implanted to selectively form a $p^+$-type embedded region.

In the ion-implanting the p-type impurities, the p-type impurities may be ion-implanted to form at least a pair of $p^+$-type embedded regions as seen in a section view taken along a surface orthogonal to a top surface of the p-type semiconductor layer. The vertical semiconductor device manufacturing method may further include forming a trench that reaches the n-type semiconductor layer located between the pair of the $p^+$-type embedded regions.

A common mark may be used in position alignment of a first photomask used in the ion-implanting the p-type impurities and position alignment of a second photomask used in the forming the trench.

The vertical semiconductor device manufacturing method may further include ion-implanting n-type impurities into part of the p-type semiconductor layer.

After epitaxially growing the p-type semiconductor layer and before forming the trench, the vertical semiconductor device manufacturing method in another example may further include epitaxially growing an $n^+$-type semiconductor layer and selectively removing the $n^+$-type semiconductor layer. The $n^+$-type semiconductor layer may be formed on the p-type semiconductor layer.

The vertical semiconductor device manufacturing method in still another example may further include ion-implanting n-type impurities. The n-type impurities may be ion-implanted into the p-type semiconductor layer in order to form an n-type upper drift layer from an uppermost surface of the p-type semiconductor layer to a portion between a pair of the $p^+$-type embedded regions.

A common mark may be used in position alignment of a first photomask used in the ion-implanting the p-type impurities and position alignment of a third photomask used in the ion-implanting the n-type impurities.

The vertical semiconductor device manufacturing method may further include ion-implanting n-type impurities into part of the p-type semiconductor layer, the part being different from the n-type upper drift layer.

Also, the vertical semiconductor device manufacturing method in another example may further include epitaxially growing the $n^+$-type semiconductor layer and selectively removing the $n^+$-type semiconductor layer, after performing ion implantation on the n-type upper drift layer, which is after epitaxially growing the p-type semiconductor layer. The $n^+$-type semiconductor layer may be formed on the p-type semiconductor layer.

The vertical semiconductor device manufacturing method may further include annealing the n-type semiconductor layer and the p-type semiconductor layer at a temperature of 1100° C. or higher and 1500° C. or lower after the ion-implanting the p-type impurities.

In a second aspect of the present invention, a vertical semiconductor device is provided. The vertical semiconductor device may include a semiconductor substrate, an n-type semiconductor layer, a p-type semiconductor layer, and a $p^+$-type embedded region. The semiconductor substrate, the n-type semiconductor layer, and the p-type semiconductor layer may be gallium nitride-based. The n-type semiconductor layer may be provided on the semiconductor substrate. The p-type semiconductor layer may be provided on the n-type semiconductor layer. The p-type semiconductor layer may not include a tail region. The tail region may be a region in which an impurity concentration distribution of majority carriers in a depth direction has a tail. The $p^+$-type embedded region may be provided selectively in a predetermined depth range across the boundary between the n-type semiconductor layer and the p-type semiconductor layer. The $p^+$-type embedded region may include the tail region.

In a third aspect of the present invention, a vertical semiconductor device is provided. The vertical semiconductor device may include a semiconductor substrate, an n-type semiconductor layer, a p-type semiconductor layer, and a $p^+$-type embedded region. The semiconductor substrate, the n-type semiconductor layer, and the p-type semiconductor layer may be gallium nitride-based. The n-type semiconductor layer may be provided on the semiconductor substrate. The p-type semiconductor layer may be provided on the n-type semiconductor layer. The $p^+$-type embedded region may be provided selectively in a predetermined depth range across the boundary between the n-type semiconductor layer and the p-type semiconductor layer. The $p^+$-type embedded region may have an upper portion and a lower portion. The lower portion may include n-type impurities and p-type impurities. The upper portion includes no n-type impurities and may include p-type impurities.

The vertical semiconductor device may also further include a trench portion and an $n^+$-type semiconductor region. The trench portion may reach the n-type semiconductor layer located between a pair of the $p^+$-type embedded regions. The $n^+$-type semiconductor region may be provided in part of the p-type semiconductor layer. The $n^+$-type semiconductor region may be provided on both sides of the trench portion.

Alternatively, the vertical semiconductor device may also further include a trench portion and an $n^+$-type semiconductor region. The trench portion may reach the n-type semiconductor layer located between a pair of the $p^+$-type embedded regions. The $n^+$-type semiconductor region may be provided on the p-type semiconductor layer. The $n^+$-type semiconductor region may be provided on both sides of the trench portion.

Alternatively, the vertical semiconductor device may further include a gate electrode and an $n^+$-type semiconductor region. The gate electrode may be provided above the p-type semiconductor layer. The $n^+$-type semiconductor region may be provided in part of the p-type semiconductor layer. The $n^+$-type semiconductor region may be provided in a region different from a region immediately below the gate electrode. The p-type semiconductor layer may have an n-type upper drift layer. The n-type upper drift layer may be provided in a region different from the $n^+$-type semiconductor region and a region immediately below the gate electrode. The n-type upper drift layer may be provided from an uppermost surface of the p-type semiconductor layer to a portion between a pair of the $p^+$-type embedded regions. The n-type upper drift layer may include n-type impurities and p-type impurities.

Alternatively, the vertical semiconductor device may further include a gate electrode and an $n^+$-type semiconductor region. The gate electrode may be provided above the p-type semiconductor layer. The $n^+$-type semiconductor region may be provided on the p-type semiconductor layer. The $n^+$-type semiconductor region may be provided adjacent to the gate electrode. The p-type semiconductor layer may have an n-type upper drift layer. The n-type upper drift layer may be provided in a region different from the $n^+$-type semiconductor region and a region immediately below the gate electrode. The n-type upper drift layer may be provided from an uppermost surface of the p-type semiconductor layer to a portion between a pair of the $p^+$-type embedded regions. The n-type upper drift layer may include n-type impurities and p-type impurities.

The summary clause does not necessarily describe all necessary features of the embodiments of the present invention. The present invention may also be a sub-combination of the features described above.

BRIEF DESCRIPTION OF THE DRAWINGS

In FIG. 3, (B) is a diagram showing a state that a photoresist on a GaN layer 20 is exposed to light via a photomask 520. In FIG. 3, (C) is a top view of a wafer 90 illustrating the positions of the marks 26.

DESCRIPTION OF EXEMPLARY EMBODIMENTS

Hereinafter, (some) embodiment(s) of the present invention will be described. The embodiment(s) do(es) not limit the invention according to the claims. Also, all the combinations of the features described in the embodiment(s) are not necessarily essential to means provided by aspects of the invention.

Figure 1:
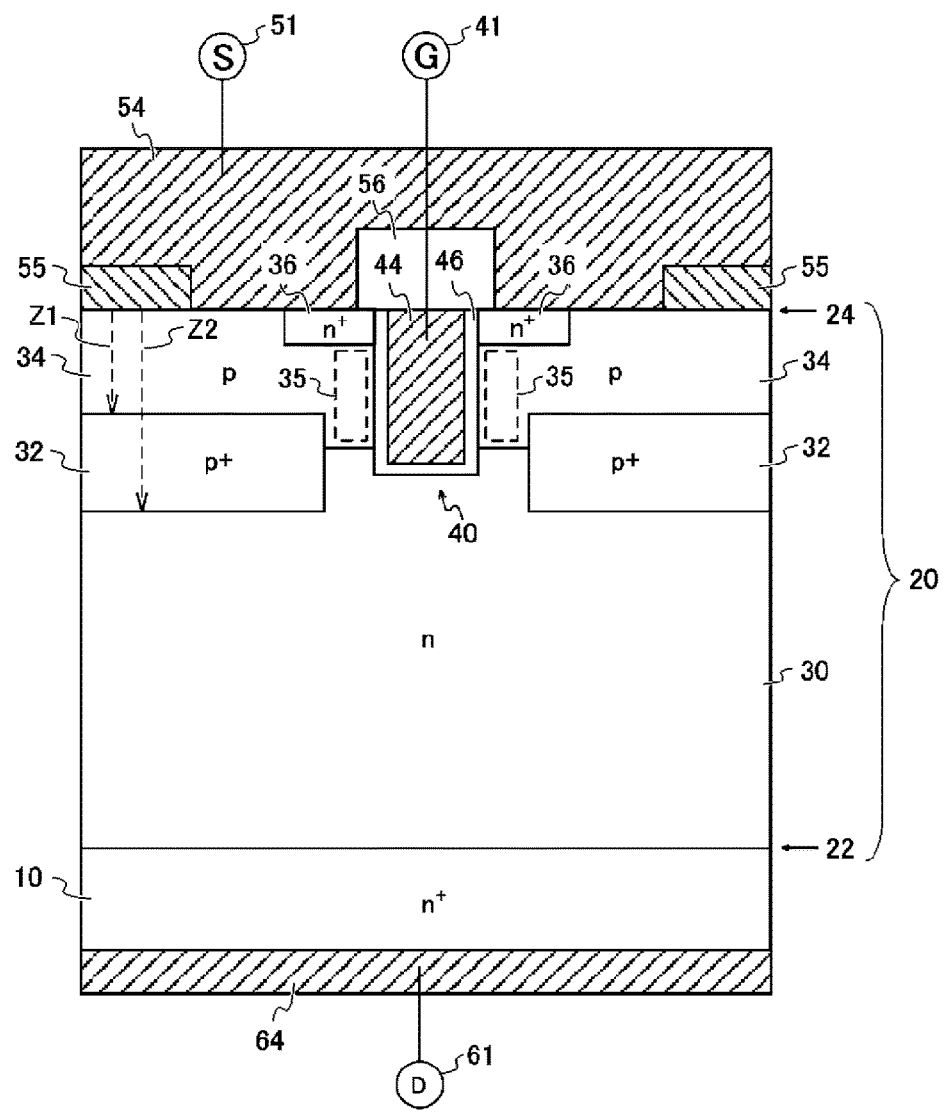
FIG. 1 is a cross-sectional view of a vertical MOSFET device 100 according to a first embodiment.

FIG. 1 is a cross-sectional view of a vertical MOSFET (metal oxide semiconductor field effect transistor) device 100 according to a first embodiment. That is, FIG. 1 is a section view of the vertical MOSFET device 100 that is taken along a surface orthogonal to a front surface 24. The vertical MOSFET device 100 is an exemplary vertical semiconductor device.

FIG. 1 shows a MOSFET unit structure of the vertical MOSFET device 100. The vertical MOSFET device 100 may have a plurality of MOSFET unit structures in the X direction. Also, the MOSFET unit structure may extend continuously in the Y direction.

In the present example, the X direction and the Y direction are directions perpendicular to each other, and the Z direction is a direction perpendicular to the X-Y plane. The X direction, the Y direction, and the Z direction form a so-called right-handed system. In the present example, +Z direction is referred to as the "upward" direction, and −Z direction is referred to as the "downward" direction. The terms "upper" and "lower" are merely used conveniently to specify the relative positions of layers, films and the like. The Z direction does not necessarily mean the gravity direction or a direction perpendicular to the ground.

The vertical MOSFET device 100 of the present example may be formed using a GaN-based semiconductor material.

The GaN-based semiconductor material may be GaN containing Al or may be GaN. That is, the GaN-based semiconductor material may mean $Al_xGa_{(1-x)}N$ (however, $0 \leq x < 1$). However, in the present example, the GaN-based semiconductor material is GaN (that is, $Al_xGa_{(1-x)}N$, where $x=0$).

The vertical MOSFET device 100 of the present example has a GaN substrate 10, a GaN layer 20, a source electrode 54, a body electrode 55, an interlayer insulating film 56, and a drain electrode 64. The GaN substrate 10 of the present example is an $n^+$-type free-standing substrate. The GaN layer 20 is located on the GaN substrate 10. The body electrode 55, the source electrode 54, and the interlayer insulating film 56 are located on the front surface 24 of the GaN layer 20. The body electrode 55 is located between a p-type base layer 34 and the source electrode 54. The body electrode 55 may directly contact the p-type base layer 34 and have a function to lower the contact resistance between the p-type base layer 34 and the source electrode 54. The interlayer insulating film 56 prevents electrical short circuit between a gate electrode 44 and the source electrode 54. The drain electrode 64 is located below the GaN substrate 10.

Note that, in the present example, n and p respectively refer to a state in which electrons are the majority carrier and a state in which holes are the majority carrier. Also, the + or − signs written to the upper right of n or p respectively mean that the carrier concentration is higher than in a case where a + sign is not written and that the carrier concentration is lower than in a case where a − sign is not written.

The GaN layer 20 of the present example has an n-type drift layer 30, a $p^+$-type embedded region 32, the p-type base layer 34, an $n^+$-type source region 36 as an $n^+$-type semiconductor region, and a trench portion 40. The n-type drift layer 30 is an exemplary n-type GaN layer provided on the GaN substrate 10. In the present example, the boundary between the GaN substrate 10 and the n-type drift layer 30 is referred to as a back surface 22 of the GaN layer 20. The n-type drift layer 30 of the present example is to epitaxially grow on the GaN substrate 10. However, in another example, a GaN-based buffer layer may be provided between the n-type drift layer 30 and the GaN substrate 10.

The p-type base layer 34 is an exemplary p-type GaN layer provided on the n-type drift layer 30. The top surface of the p-type base layer 34 is aligned with the front surface 24 of the GaN layer 20. The p-type base layer 34 of the present example is epitaxially grown on the n-type drift layer 30. Therefore, the p-type base layer 34 of the present example directly contacts the n-type drift layer 30. However, most of the direct contact between the n-type drift layer 30 and the p-type base layer 34 is prevented by the $p^+$-type embedded region 32, the trench portion 40, an n-type upper drift layer 38, which will be described in the third embodiment, and the like.

The $p^+$-type embedded region 32 is selectively provided in a predetermined depth range across the boundary between the n-type drift layer 30 and the p-type base layer 34. The depth means the depth from the front surface 24 of the GaN layer 20. Also, the depth range means, for example, the range from a depth position Z1 to a depth position Z2 that is a deeper position than the depth position Z1.

In the present example, the boundary between the n-type drift layer 30 and the p-type base layer 34 is located between the depth position Z1 located in the p-type base layer 34 and the depth position Z2 located in the n-type drift layer 30. The $p^+$-type embedded region 32 is provided from a position shallower than the boundary between the n-type drift layer 30 and the p-type base layer 34 to a position deeper than the boundary.

The $p^+$-type embedded region 32 may have an impurity concentration distribution formed by ion implantation performed once or may also have an impurity concentration distribution formed by ion implantations performed multiple times. In FIG. 1, a pair of the $p^+$-type embedded regions 32 is formed on both sides of and outside the trench portion 40. In the present example, a pair of the $p^+$-type embedded regions 32 is provided to be separate from the channel forming regions 35 on both sides of the trench portion 40. For example, the separation distance in the X direction between a side of the trench portion 40 and an end of the $p^+$-type embedded region 32 located in the vicinity of the channel forming region 35 is shorter than the width of the $n^+$-type source region 36 in the X direction. Note that the separation distance may also be longer than the width of the $n^+$-type source region 36 in the X direction. Also, the separation distance may be shorter in the X direction than the distance between the trench portion 40 and an end of the body electrode 55, the end facing the trench portion 40 in the X direction. A pair of the $p^+$-type embedded regions 32 may be continuous in a U shape or an O shape when the vertical MOSFET device 100 is seen from above.

The $p^+$-type embedded region 32 of the present example has a function to increase the reverse breakdown voltage of the vertical MOSFET device 100, compared to a case where there is no $p^+$-type embedded regions 32 when an input voltage to the gate electrode 44 is at Low level (that is, when the gate is off).

In the vertical MOSFET, the reverse breakdown voltage increases to an extent that the depletion layer at the time that the gate is off can expand upwardly and downwardly. The $p^+$-type embedded region 32 of the present example has p-type impurities at a higher concentration than the p-type base layer 34. When the gate is off, the thickness of the depletion layer expanding upwardly becomes thinner in a case where there is the $p^+$-type embedded region 32 in addition to the p-type base layer 34 than a case where there is only the p-type base layer 34. That is, the voltage can be increased until the depletion layer reaches the source electrode 54 or the $n^+$-type source region 36. Thus, by providing the $p^+$-type embedded region 32, the reverse breakdown voltage of the vertical MOSFET device 100 at the time that the gate is off can be increased.

In the vertical MOSFET device 100 of the present example, a low potential (for example, the ground potential) is supplied to the source electrode 54 from a source terminal 51. Also, a high potential (for example, 1 kV) is supplied to the drain electrode 64 from a drain terminal 61. The p-type base layer 34 is connected to the source electrode 54, and the n-type drift layer 30 is connected to the drain electrode 64 via the GaN substrate 10. The pn junction formed of the p-type base layer 34 and the n-type drift layer 30 receives reverse bias when the gate is off. In the present example, in order to increase the reverse breakdown voltage of the pn junction, the $p^+$-type embedded region 32 is provided. In contrast, a HEMT device has, in the first place, no pn junctions to which reverse bias voltage is applied. Therefore, note that providing the $p^+$-type embedded region 32 in a HEMT device does not serve to increase the reverse breakdown voltage at the time of reverse bias.

The vertical MOSFET device 100 of the present example is normally-OFF type. A High or Low input voltage value is supplied to the gate electrode 44 of the present example from a gate terminal 41. In the vertical MOSFET device 100 of the present example, according to the input voltage value to the gate electrode 44, the channel forming region 35 in the p-type base layer 34 can be generated or extinguished. On the other hand, the HEMT device is a normally-ON type HEMT device, and the CBL is provided to prevent leakage current. Therefore, the $p^+$-type embedded region 32 of the present example has the different purposes and functions from those of CBL used in HEMT devices.

In the present example, after the n-type drift layer 30 and the p-type base layer 34 are epitaxially grown, p-type impurities are ion-implanted in order to form the $p^+$-type embedded region 32 in the n-type drift layer 30 and the p-type base layer 34. Therefore, the crystallinity of the p-type base layer 34 can be prevented from lowering, compared to a case where the $p^+$-type embedded region 32 is selectively regrown. In addition, by preventing the crystallinity from lowering, the mobility of the p-type base layer 34 can be increased, and specifically, increase in the mobility of the channel forming region 35 can improve the current characteristic of the vertical MOSFET device 100.

The $n^+$-type source region 36 is an $n^+$-type GaN region. At least part of the $n^+$-type source region 36 of the present example is exposed to the front surface 24. The $n^+$-type source regions 36 may be provided on both sides of the trench portion 40 in the X-direction. The $n^+$-type source regions 36 may directly contact the side of the trench portion 40. In FIG. 1, a pair of the $n^+$-type source regions 36 is provided on both sides of the trench portion 40. Note that a pair of $n^+$-type source regions 36 may be continuous in a U shape or an O shape when the vertical MOSFET device 100 is seen from above.

A region of the p-type base layer 34, the region being located on the side of the trench portion 40, may be the channel forming region 35. In FIG. 1, there is a pair of the channel forming regions 35 on both sides of the trench portion 40. The channel forming region 35 may be located between the n-type drift layer 30 and the $n^+$-type source region 36.

The trench portion 40 of the present example has a trench 42 (shown in FIG. 2), the gate electrode 44, and a gate insulating film 46. The gate insulating film 46 of the present example is provided to directly contact the inner wall of the trench 42. The inner wall of the trench 42 may have a bottom and sides. The gate electrode 44 of the present example is provided to directly contact the gate insulating film 46.

Figure 2:
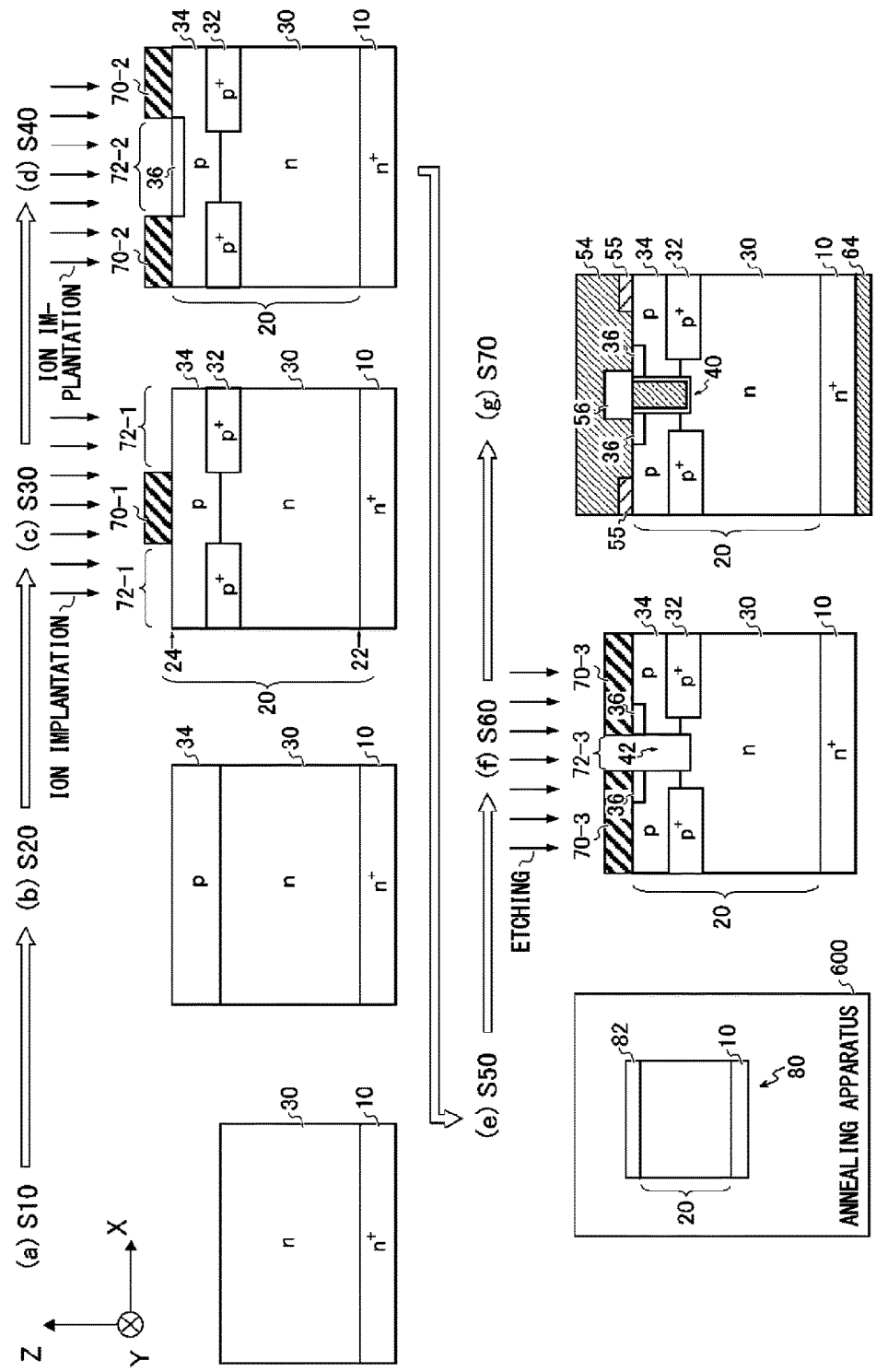
In FIG. 2, (a) through (g) are cross-sectional views showing respective steps of a manufacturing method of the vertical MOSFET device 100.

In FIG. 2, (a) through (g) are cross-sectional views showing respective steps of a manufacturing method of the vertical MOSFET device 100. The respective steps of the present example are performed in the order of step S10 to S70 (that is, the order from the smaller number).

In FIG. 2, (a) shows a step (S10) of epitaxially growing an n-type GaN layer. The n-type GaN layer of the present example corresponds to the n-type drift layer 30. The n-type drift layer 30 may be epitaxially grown by metal organic chemical vapor deposition (MOCVD), halide vapor phase epitaxy (HVPE), or the like.

In a case where the n-type drift layer 30 is epitaxially grown by MOCVD, raw material gas containing trimethylgallium ($Ga(CH_3)_3$), ammonia ($NH_3$), and monosilane ($SiH_4$), and pressing gas containing nitrogen ($N_2$) and hydrogen ($H_2$), may be allowed to flow onto the heated GaN substrate 10. Note that kinds of the raw material gas and the pressing gas are not limited to the above-described examples.

The n-type drift layer 30 may have n-type impurities of $1E+15$ $cm^{-3}$ or more and $5E+15$ $cm^{-3}$ or less. The n-type impurities may be one or more kinds of elements out of Si (silicon), Ge (germanium) and O (oxygen). In the present example, Si of $SiH_4$ functions as n-type impurities.

In FIG. 2, (b) shows a step (S20) of epitaxially growing a p-type GaN layer. The p-type GaN layer of the present example corresponds to the p-type base layer 34. The p-type base layer 34 may also be epitaxially grown on the n-type drift layer 30 by MOCVD, HVPE, or the like.

In a case where the p-type base layer 34 is epitaxially grown by MOCVD, raw material gas containing trimethylgallium, ammonia, and bis(cyclopentadienyl)magnesium ($Cp_2Mg$), and pressing gas containing nitrogen ($N_2$) and hydrogen ($H_2$), may be allowed to flow onto the GaN substrate 10 and the n-type drift layer 30 that are heated.

The p-type base layer 34 may have p-type impurities of $1E+16$ $cm^{-3}$ or more and $1E+18$ $cm^{-3}$ or less. The p-type impurities may be one or more kinds of elements out of Mg (magnesium), Hg (mercury), Be (beryllium), and Zn (zinc). In the present example, Mg of $Cp_2Mg$ functions as the p-type impurities.

In FIG. 2, (c) shows a step (S30) of ion-implanting p-type impurities. Step S30 is for ion implantation to form the $p^+$-type embedded region 32 selectively in a predetermined depth range across the boundary between the n-type drift layer 30 and the p-type base layer 34. The $p^+$-type embedded region 32 is formed by ion-implanting the p-type impurities to the upper portion of the n-type drift layer 30 and the lower portion of the p-type base layer 34. Because of this, the $p^+$-type embedded region 32 has the upper portion that directly contacts the n-type drift layer 30 and the lower portion that directly contacts the p-type base layer 34. These two portions in the $p^+$-type embedded region 32 are different in the impurities contained therein. That is, the lower portion of the $p^+$-type embedded region 32 contains the n-type impurities and the p-type impurities, and the upper portion of the $p^+$-type embedded region 32 contains only the p-type impurities. In the present example, Si is used as the n-type impurities, and Mg is used as the p-type impurities, and therefore, the lower portion of the $p^+$-type embedded region 32 contains Si and Mg, and the upper portion of the $p^+$-type embedded region 32 contains Mg but does not contain Si. In contrast, in a conventional example of forming a CBL, which is a $p^+$-type embedded region, by epitaxial growth, the impurities are only p-type impurities. Thus, they can be clearly differentiated.

In step S30, a mask material 70-1 is provided selectively on the front surface 24. The mask material 70-1 may have a plurality of openings 72-1. In a case where impurities are ion-implanted to the GaN layer 20, the mask material 70-1 has a function to prevent the impurities from penetrating the GaN layer 20. In contrast, the impurities can penetrate the GaN layer 20 via the plurality of openings 72-1. Because of this, the $p^+$-type embedded region 32 can be selectively formed below the opening 72. The $p^+$-type embedded region 32 may have a predetermined Mg concentration of $1E+18$ $cm^{-3}$ or more and $1E+21$ $cm^{-3}$ or less.

In step S30, the p-type impurities are ion-implanted with a predetermined accelerating voltage and in a predetermined dose amount. Also, the p-type impurities may also be ion-implanted several times by changed accelerating voltages and dose amounts. Thus, the p-type impurities may also be implanted in multiple steps. The ion species to be ion-implanted may be above-described one or more kinds of elements. The ion species of the present example is Mg.

The mask material 70 may be a photoresist or silicon dioxide (hereinafter referred to as $SiO_2$). The photoresist may be patterned by the commonly used photolithography process. In contrast, in a case where the mask material 70 is SiO$_2$, SiO$_2$ may be patterned by the photolithography process and the etching process after blanket deposition of SiO$_2$ by the CVD (chemical vapor deposition) process. Note that after the ion implantation, the mask material 70 on the GaN layer 20 is removed.

As a comparative example, a case where the p$^+$-type layer is epitaxially grown on the n-type drift layer 30, and the p$^+$-type layer is partially removed to form the above-described p$^+$-type embedded region 32 is considered. In this case, the p-type base layer 34 is required to be regrown on the stepped structure generated by partially removing the p$^+$-type layer. In a case where there is a stepped structure, the crystallinity of the epitaxial layer in the vicinity of the stepped structure lowers, compared to a case where the layer is epitaxially grown on a plane with no stepped structures.

Also, in a case where the p$^+$-type layer is partially removed in the comparative example, it is removed by etching, and therefore damage remains in the n-type drift layer 30. The remaining damage is transferred to the epitaxial layer, and therefore, the crystallinity of the upper epitaxial layer lowers.

In contrast, in the present example, the p-type impurities are ion-implanted in order to form the p$^+$-type embedded region 32 after the p-type base layer 34 is formed. That is, in the present example, the p-type base layer 34 is not to be regrown on the n-type drift layer 30 in which the p$^+$-type layer is partially removed. Therefore, compared to the regrowing method, the crystallinity of the p-type base layer 34 can be increased.

In FIG. 2, (d) shows a step (S40) of ion-implanting the n-type impurities to part of the p-type base layer 34. Step (S40) is for ion implantation to form the n$^+$-type source region 36. The n$^+$-type source region 36 of the present example is provided from the front surface 24 of the p-type base layer 34 to a predetermined depth position. In step S40, an opening 72-2 of a different pattern from that in step S30 is provided in a mask material 70-2. Then, n-type impurities are injected into the p-type base layer 34 via the opening 72-2. After the ion implantation, the mask material 70-2 on the top surface of the GaN layer 20 is removed.

In FIG. 2, (e) shows a step (S50) of annealing the GaN layer 20 at a temperature of 1100° C. or higher and 1500° C. or lower. Step S50 may include forming a cap layer 82 on the entire front surface 24 before performing the annealing. Similarly, the cap layer 82 may also be formed on the entire back surface. In the present example, before the annealing, a laminate 80 of the GaN substrate 10, the GaN layer 20, and the cap layer 82 is formed. Note that in the present example, annealing the GaN layer 20 means the same as annealing the laminate 80.

The cap layer 82 may be formed by CVD. The cap layer 82 may be an aluminum nitride (hereinafter referred to as AlN) layer, a SiO$_2$ layer, or a silicon nitride layer. The cap layer 82 of the present example is an AlN layer. The AlN layer has a function to prevent nitrogen atoms from being released from the GaN layer 20. Nitrogen vacancies will be formed at positions in a GaN layer 20 from which nitrogen atoms have been released. The nitrogen vacancies may function as donor-type defects, and therefore, this may hinder the onset of the p-type characteristics. In order to prevent this, in the present example, the cap layer 82 that directly contacts the front surface of the GaN layer 20 is provided.

Desirably, the cap layer 82 is highly heat-resistant, has good adhesiveness with the front surface 24, does not allow the impurities to diffuse into the GaN layer 20 therefrom, and can be selectively removed with respect to the GaN layer 20. The highly heat-resistant cap layer 82 means that the cap layer 82 is substantially not decomposed to such a degree that no pits (penetrating openings) are formed in the cap layer 82 even in a case where the cap layer 82 is annealed at a temperature of 1100° C. or higher and 1500° C. or lower.

The cap layer 82 of the present example is an AlN layer but may be a silicon dioxide (SiO$_2$) layer or also a silicon nitride (SiN) layer. However, in order to eliminate possibilities of Si or O diffusing into the GaN layer 20, an AlN layer is desired. The AlN layer has an advantage that it can be removed from the GaN layer 20 and it does not become n-type or p-type impurities with respect to the GaN layer 20.

In step S50, the laminate 80 is arranged inside an annealing chamber of an annealing apparatus 600. Then, the laminate 80 is held at the annealing temperature, and the pressure inside the annealing chamber is maintained at the predetermined pressure. Because of this, the laminate 80 is annealed. The annealing temperature may also be a predetermined temperature of 1200° C. or higher and 1500° C. or lower, and more preferably it may also be a predetermined temperature of 1300° C. or higher and 1500° C. or lower. The predetermined temperature may vary in a range of ±25° C. Note that the p-type impurities are not activated at a temperature lower than 1100° C. The present example is different from a Si semiconductor device in this regard.

Gas inside the annealing chamber may be gas containing one or more kinds out of nitrogen gas and ammonia gas. At the time of annealing, the pressure inside the annealing chamber is maintained at a predetermined pressure. The predetermined pressure may also vary in a range of ±10%. Note that the pressure may also be a normal pressure.

In step S50, the n-type and p-type impurities in the GaN layer 20 are activated. Also, in step S50, damage on the crystals due to the ion implantation can be cured to a certain extent. Only after the p$^+$-type embedded region 32 and the n$^+$-type source region 36 are processed through step S50, they can serve the aimed functions.

In FIG. 2, (f) shows a step (S60) of forming the trench 42. In step S60, an opening 72-3 of a different pattern from those in step S30 and step S40 is provided in a mask material 70-3. Then, the GaN layer 20 below the opening 72-3 is removed by etching. The trench 42 of the present example extends from the front surface 24 to penetrate the p-type base layer 34 and reach the n-type drift layer 30 located between a pair of the p$^+$-type embedded regions 32.

In FIG. 2, (g) shows a step (S70) of forming electrodes and the like. First, the gate insulating film 46, the gate electrode 44, and the interlayer insulating film 56 are formed by appropriately using the CVD process, the photolithography process, and the etching process. The gate insulating film 46 may be a SiO$_2$ film or also an Al$_2$O$_3$ film. The gate electrode 44 may be polysilicon. The interlayer insulating film 56 may be a BPSG (Boro-Phospho Silicate Glass) or a SiO$_2$ film. Subsequently, the body electrode 55, the source electrode 54, and the drain electrode 64 are formed by sputtering. The body electrode 55 may also be a Pd layer, and the source electrode 54 and the drain electrode 64 may be laminated layers of a titanium (Ti) layer and an Al layer.

After step S70, annealing may also be performed to improve the ohmic contact. A step of forming a passivation film and a step of providing an opening in the passivation film may be further provided. Also, at an appropriate timing in step S10 to S70, a step of forming other configuration such as an edge termination structure portion may also be further provided. Finally, a wafer including the GaN substrate 10, the GaN layer 20, and the like is diced, thereby separating semiconductor chips, each of which will be a vertical MOSFET device 100.

Figure 3:
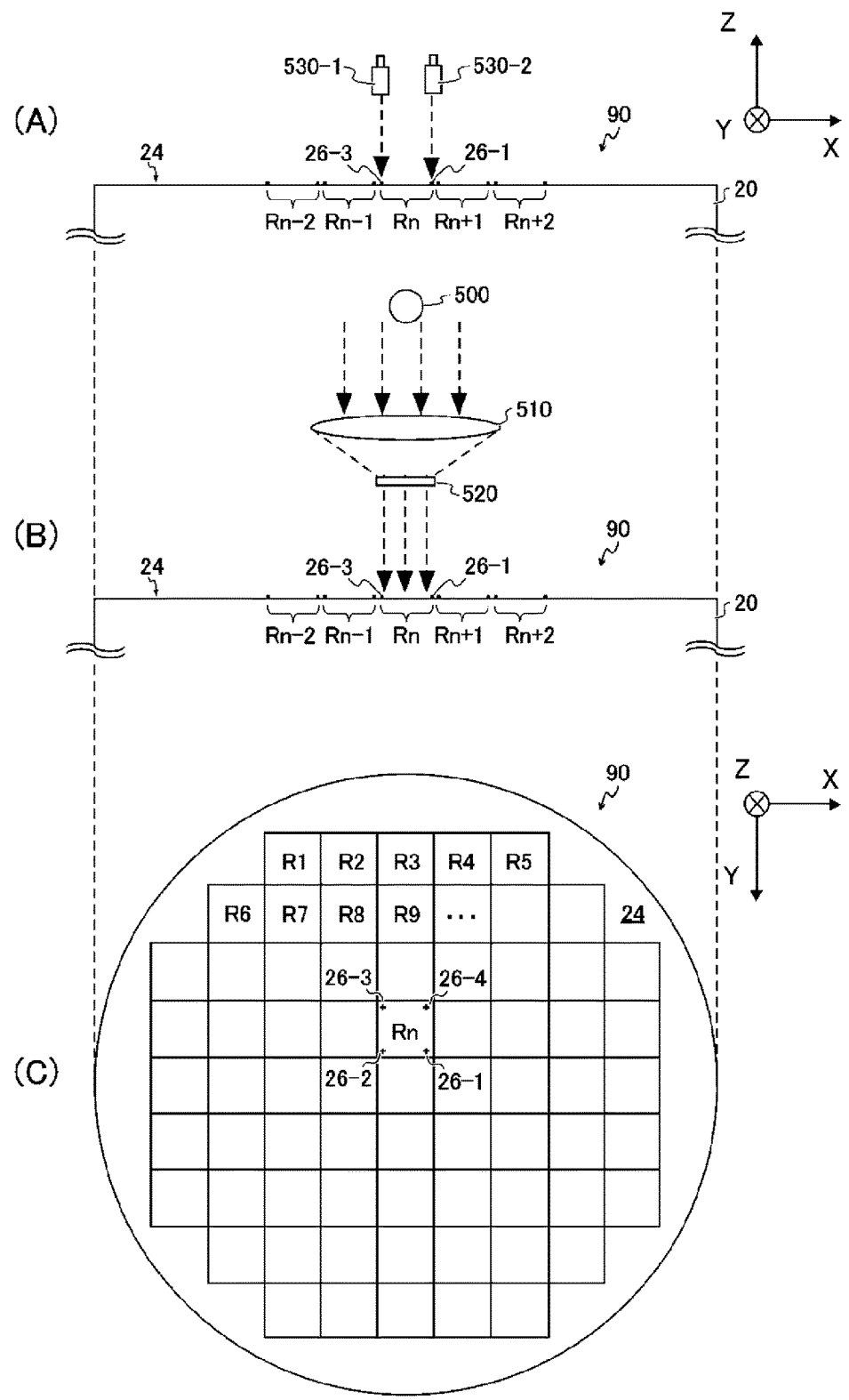
In FIG. 3, (A) is a diagram showing a state that positions of marks 26 are observed.

In FIG. 3, (A) is a diagram showing a state that positions of the marks 26 are observed. In FIG. 3, (B) is a diagram showing a state that a photoresist on the GaN layer 20 is exposed to light via a photomask 520. In FIG. 3, (C) is a top view of a wafer 90 illustrating the positions of the marks 26. In FIG. 3, (A) through (C) show the semiconductor chips before being cut out from the wafer 90.

As shown in (A) of FIG. 3, each rectangular region Rn in the wafer 90 may have a plurality of marks 26 on the front surface 24 of the GaN layer 20. Note that one rectangular region Rn may correspond to one semiconductor chip. The mark 26 may be a recessed portion provided by laser processing or the like or also be a protruding portion formed by patterning a conductive material. The mark 26 of the present example is a cross-shaped Al pattern that protrudes upwardly from the front surface 24.

As shown in (B) of FIG. 3, light emitted from a light source 500 enters the photomask 520 via a lens 510. The photomask 520 is also called a reticle. The photomask 520 has a predetermined opening pattern. The photoresist formed on the front surface 24 is exposed to light via the photomask 520. The photoresist may be negative-type or positive-type. By developing the photoresist, the predetermined opening pattern in the photomask 520 is transcribed in the photoresist.

As shown in (C) of FIG. 3, the wafer 90 has the same structure for each of the predetermined rectangular regions Rn (n is a natural number). After forming the photoresist, each of the rectangular regions Rn is sequentially exposed to light using the same photomask 520. For example, rectangular regions R1, R2, R3 and so on are sequentially exposed to light. Therefore, it is required to accurately align the position of the photomask 520 with respect to the wafer 90.

In the present example, first, positions of the marks 26 in the rectangular region Rn are observed by a position-aligning camera 530 shown in (A) of FIG. 3. Then, in order to correct misalignment of the positions between the rectangular region Rn and the photomask 520, the position of the wafer 90 is corrected. In order to correct the position of the wafer 90, the stage on which the wafer 90 is arranged may be moved in parallel or rotationally. Observation of the rectangular region Rn by using the position-aligning camera 530 and correction of the position of the wafer 90 may be performed each time each of the rectangular regions Rn is exposed to light. Next, the photoresist in the rectangular region Rn is exposed to light via the photomask 520.

Figure 4:
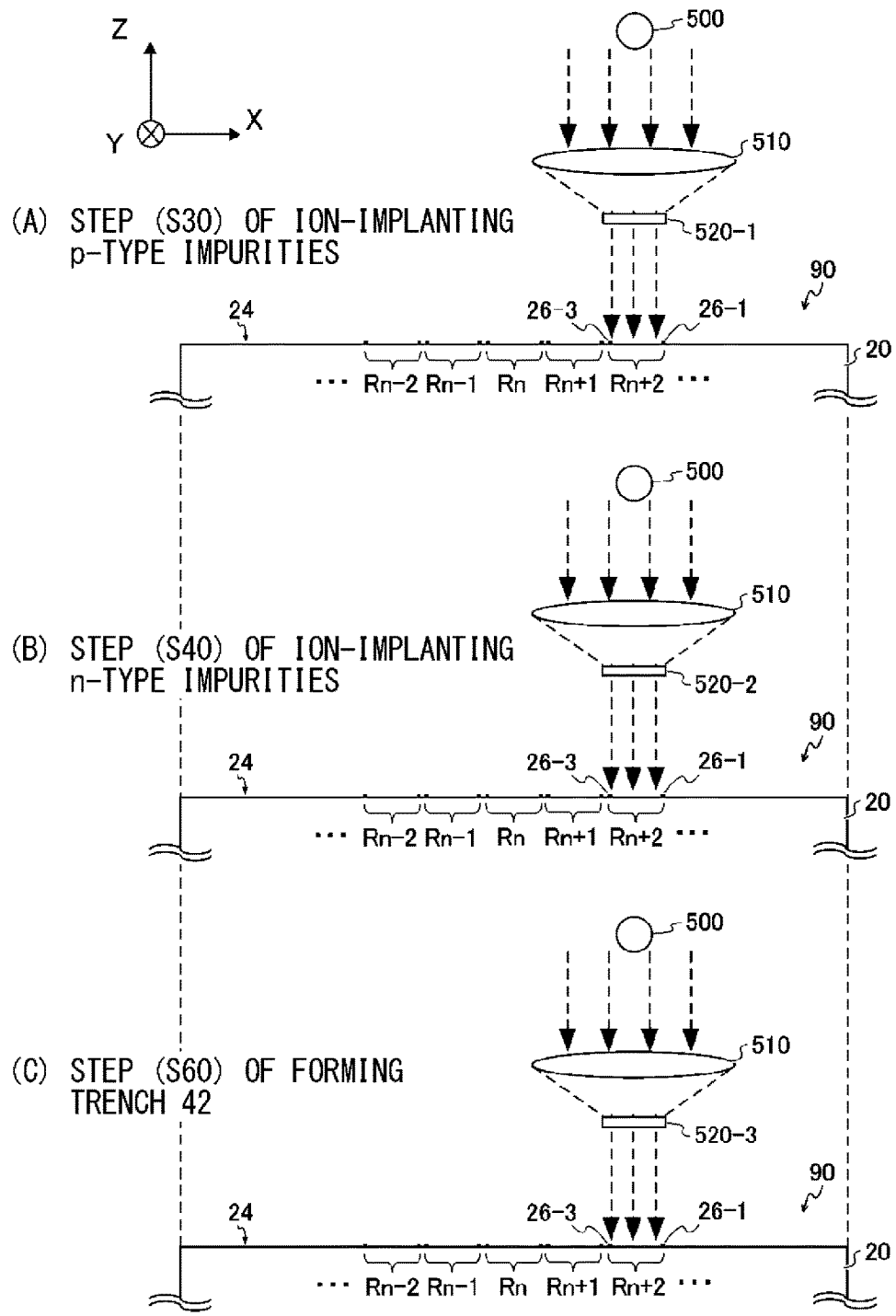
In FIG. 4, (A) through (C) are side views of the wafer 90 illustrating the positions of the marks 26 in steps S30, S40, and S60.

In FIG. 4, (A) through (C) are side views of the wafer 90 illustrating positions of the marks 26 in steps S30, S40, and S60. In FIG. 4, (A) corresponds to the step (S30) of ion-implanting p-type impurities in (c) of FIG. 2. In FIG. 4, (B) corresponds to the step (S40) of ion-implanting n-type impurities in (d) of FIG. 2. In FIG. 4, (C) corresponds to the step (S60) of forming the trench 42 in (f) of FIG. 2.

In the present example, an epitaxial layer is not formed on the p-type base layer 34 after the p-type base layer 34 is epitaxially grown. Therefore, in steps S30, S40, and S60, the front surface 24 is the uppermost surface of the GaN layer 20 (thus, the uppermost surface of the wafer 90). Thus, a common mark can be used in position alignment of a photomask 520-1 as the first photomask to be used in step S30, a photomask 520-2 to be used in step S40, and a photomask 520-3 as the second photomask to be used in step S60.

Figure 5:
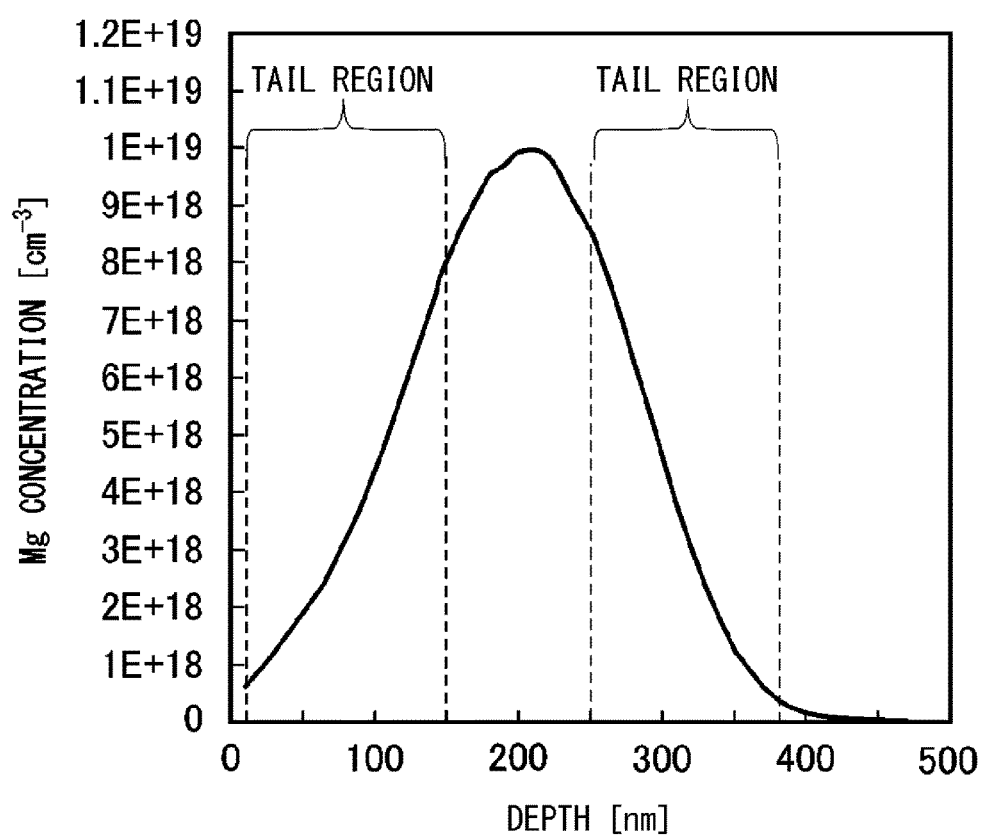
FIG. 5 is a graph illustrating a concentration distribution of p-type impurity concentration after the p-type impurities are ion-implanted and annealing is performed.

FIG. 5 is a graph illustrating a concentration distribution of p-type impurity concentration after p-type impurities are ion-implanted in step (S30) and annealed in annealing step (S50). The horizontal axis shows the depth [nm] from the front surface 24. Note that the position of the front surface 24 is assumed to be 0 nm. The vertical axis shows Mg impurity concentration [$cm^{-3}$].

In step S30, Mg is ion-implanted by an accelerating voltage of 10 keV or higher and 200 keV or lower and a dose amount of 1E+13 $cm^{-2}$ or more and 1E+15 $cm^{-2}$ or less. In the present example, the ion implantation is performed once under a condition that the accelerating voltage is 180 keV and the dose amount is 2E+14 $cm^{-2}$.

Subsequently, the concentration distribution of the p-type impurities is formed through the annealing step (S50). In the present example, a p-type impurities region of 1E+19 $cm^{-3}$ at a depth position of 200 nm and of 1E+18 $cm^{-3}$ or more and 1E+19 $cm^{-3}$ or less in the range from 25 nm to 360 nm depth position, can be obtained. The p-type impurities region may be regarded as the $p^+$-type embedded region 32.

The distribution of the dose amount in ion implantation takes a shape similar to that of Gaussian distribution. Even if the impurities are implanted in multiple steps so as to make the impurity concentration distribution a box shape, a tail region in which the impurity concentration is uneven is formed on both ends of the impurity concentration distribution. That is, the $p^+$-type embedded region 32 includes the tail region where the impurity concentration distribution of the majority carriers in the depth direction has a tail. In the present example, the tail region mean that the depth-direction length required for the impurity concentration to be lowered by an order of magnitude is 50 nm or longer.

In contrast, a region in which the depth-direction length required for the impurity concentration to be lowered by an order of magnitude is less than 50 nm is defined not as a tail region in the present example. For example, the n-type drift layer 30 and the p-type base layer 34 that are epitaxially grown do no include the tail region defined in the present example, although it is assumed that a small amount of impurities diffuse in the annealing step (S50).

Figure 6:
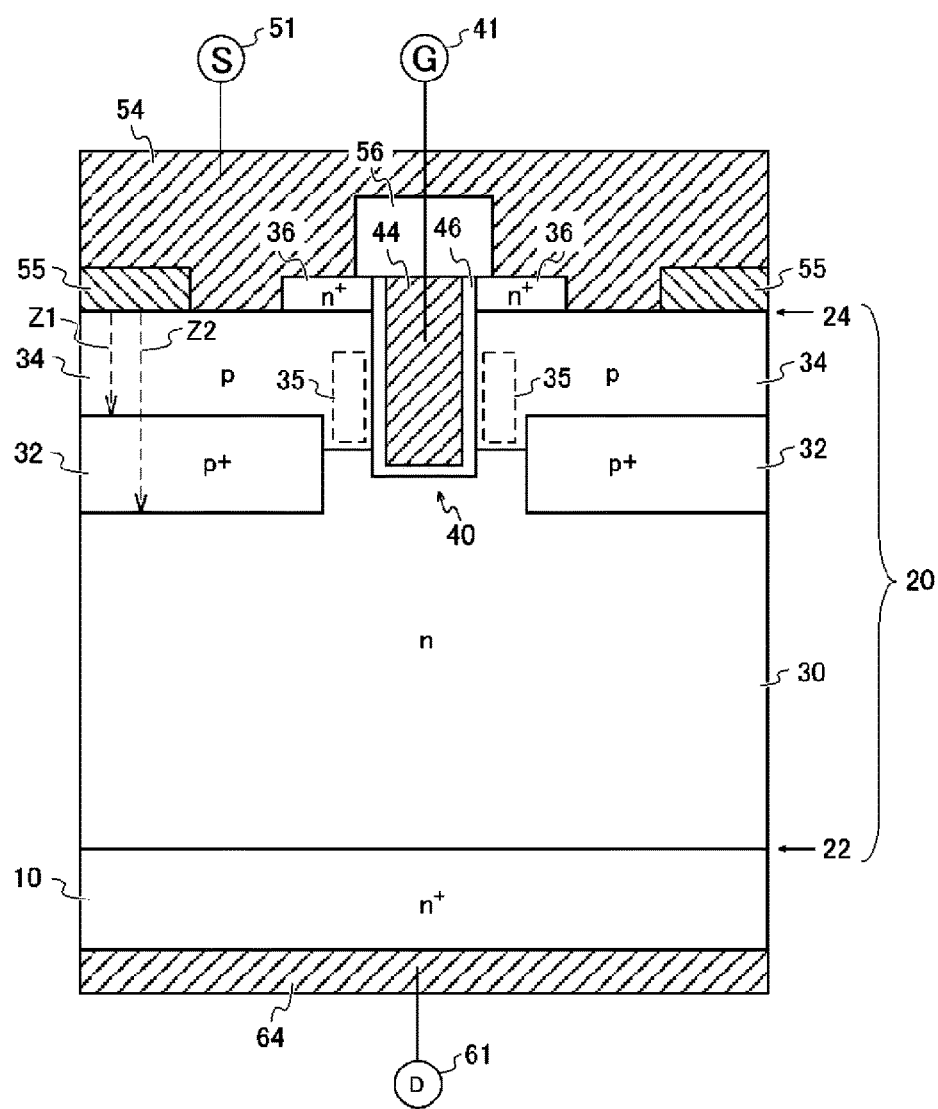
FIG. 6 is a cross-sectional view of a vertical MOSFET device 200 according to a second embodiment.

FIG. 6 is a cross-sectional view of the vertical MOSFET device 200 according to the second embodiment. The present example is different from the first embodiment in that the $n^+$-type source region 36 is epitaxially grown. The present example may be the same as the first embodiment in the other regards. Note that also in the present example, the crystallinity in the p-type base layer 34 can be prevented from lowering.

Figure 7:
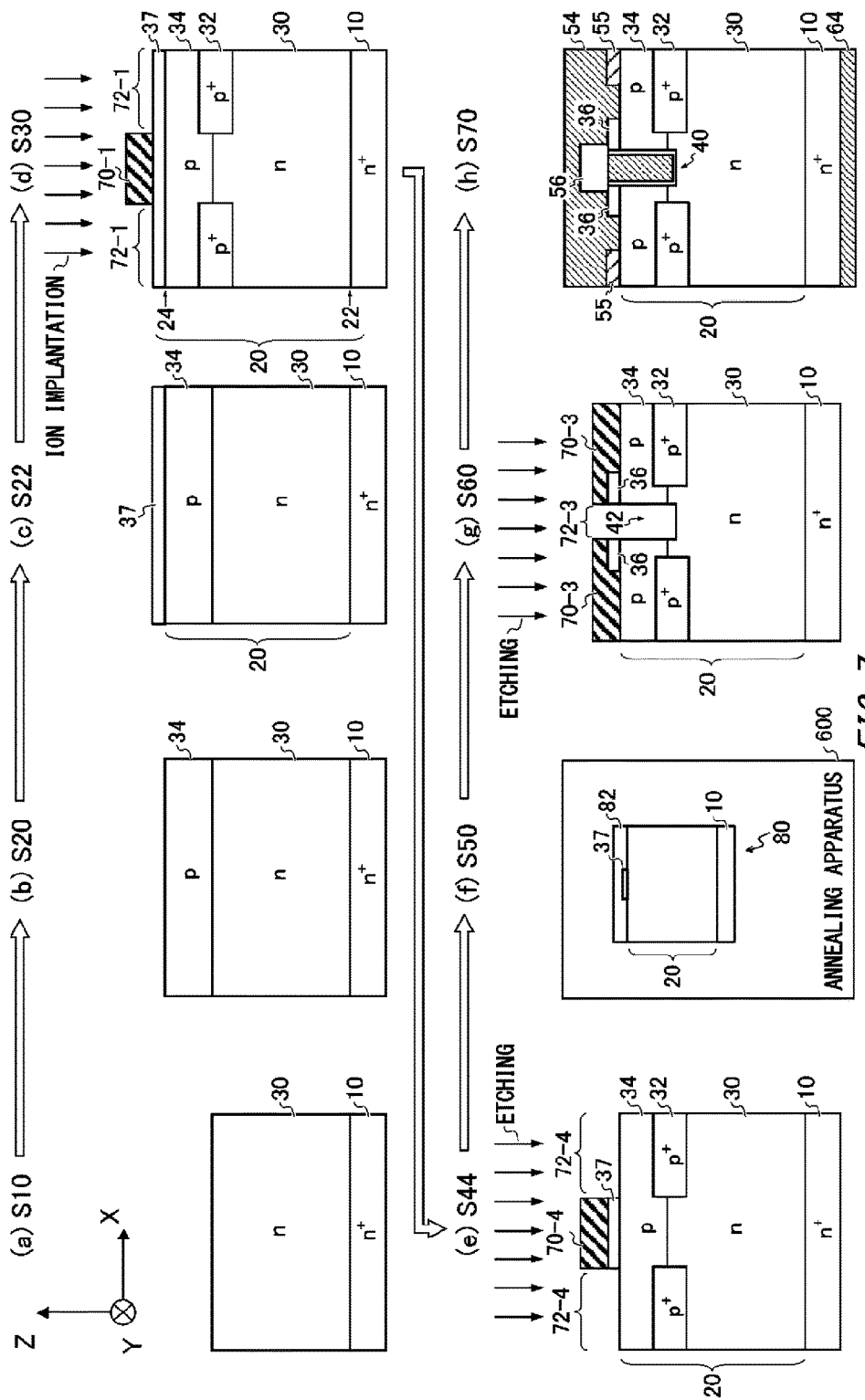
In FIG. 7, (a) through (h) are cross-sectional views showing respective steps of a manufacturing method of the vertical MOSFET device 200.

In FIG. 7, (a) through (h) are cross-sectional views showing respective steps of a manufacturing method of the vertical MOSFET device 200. Steps S10 and S20 in (a) and (b) of FIG. 7 are the same as steps S10 and S20 in (a) and (b) of FIG. 2, and therefore, overlapping explanation is omitted. Also in the present example, the respective steps are performed in the order of step S10 to S70 (that is, in the order from the smaller number).

In FIG. 7, (c) shows a step (S22) of epitaxially growing an $n^+$-type source layer 37 on the p-type base layer 34. The $n^+$-type source layer 37 is an exemplary $n^+$-type semiconductor layer. The $n^+$-type source layer 37 may also be a GaN-based semiconductor material. The $n^+$-type source layer 37 of the present example is an $n^+$-type GaN layer. In this way, in the present example, the n-type drift layer 30, the p-type base layer 34, and the $n^+$-type source layer 37 are sequentially epitaxially formed.

In FIG. 7, (d) shows a step similar to (c) of FIG. 2, and shows a step (S30) of ion-implanting p-type impurities. Step S30 shows an ion implantation step to form the $p^+$-type embedded region 32 selectively in a predetermined depth range across the boundary between the n-type drift layer 30 and the p-type base layer 34.

In FIG. 7, (e) shows a step (S44) of selectively removing the n⁺-type source layer 37. In step S44, an opening 72-4 of a different pattern from that in step S30 is provided in a mask material 70-4. Then, the n⁺-type source layer 37 below the opening 72-4 is removed by etching. Because of this, the n⁺-type source layer 37 is removed selectively with respect to the GaN layer 20.

Step S50 in (f) of FIG. 7 is the same as step S50 in (e) of FIG. 2, and therefore, overlapping explanation is omitted. In step S60 in (g) of FIG. 7, when the trench 42 is formed, the etching is performed such that it penetrates the n⁺-type source layer 37. Because of this, the n⁺-type source layer 37 becomes the n⁺-type source regions 36. The n⁺-type source region 36 is provided on both sides of the trench portion 40. In FIG. 7, (f) is different from step S60 in (f) of FIG. 2 in the above-described regard. It is the same as step S60 in (f) of FIG. 2 in the other regards. Note that step S70 in (h) of FIG. 7 is the same as step S70 in (e) of FIG. 2, and therefore overlapping explanation is omitted.

Figure 8:
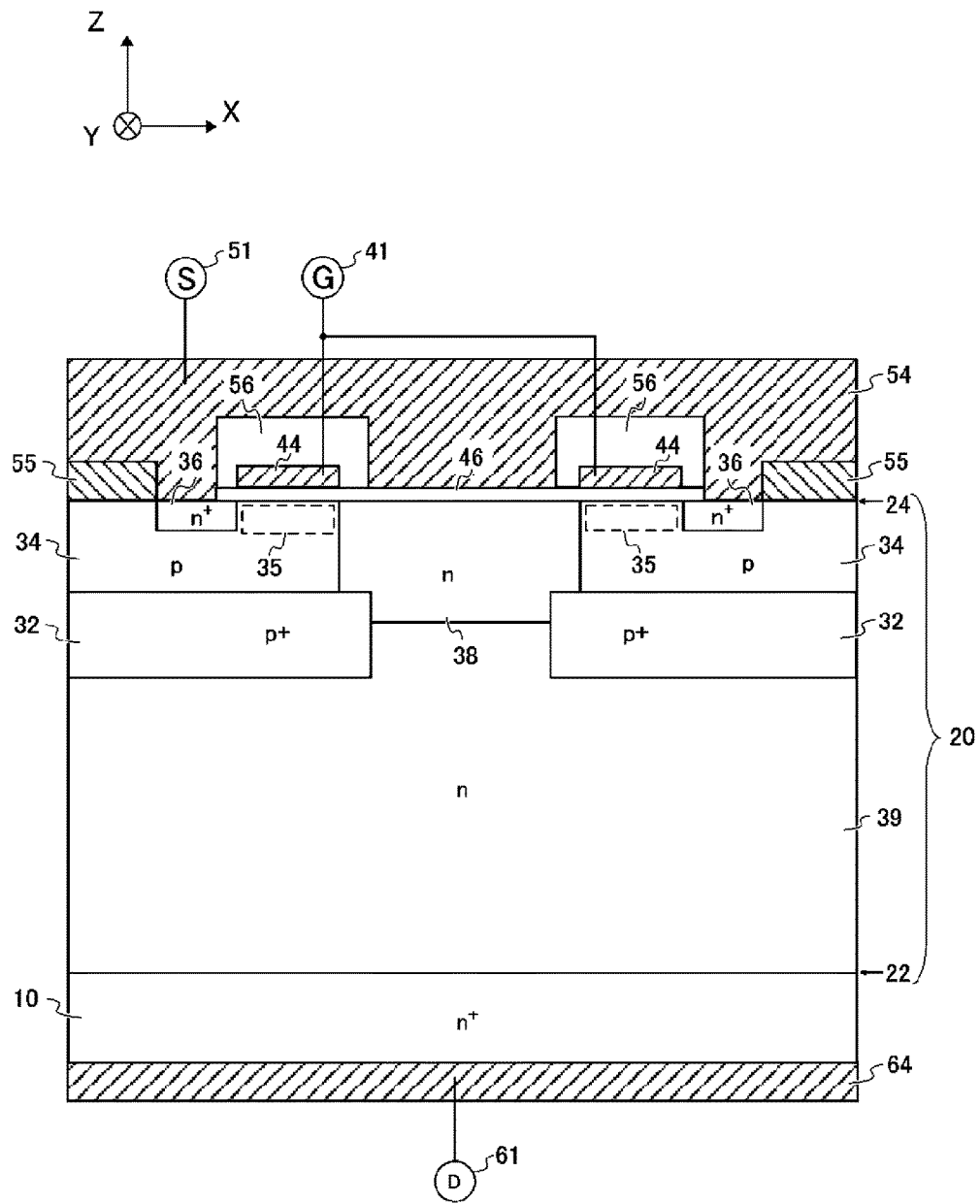
FIG. 8 is a cross-sectional view of a vertical MOSFET device 300 according to a third embodiment.

FIG. 8 is a cross-sectional view of a vertical MOSFET device 300 according to the third embodiment. In the present example, the gate structure is not a trench type but a planar type. The planar type gate electrode 44 is provided above the p-type base layer 34 with the gate insulating film 46 interposed therebetween. Also, by counter-doping part of the p-type base layer 34, the n-type upper drift layer 38 is provided. Specifically, the p-type base layer 34 has the n-type upper drift layer 38 from the front surface 24, which is the uppermost surface of the p-type base layer 34, to a portion between a pair of the p⁺-type embedded regions 32. The n-type upper drift layer 38 is located in a region different from the n⁺-type source region 36 and the channel forming region 35 immediately below the gate electrode 44. In the present example, there is the n-type upper drift layer 38, and therefore, the n-type drift layer 30 is referred to as an n-type lower drift layer 39. The third embodiment is different from the first embodiment in the above-described regard. The third embodiment is the same as the first embodiment in the other regards. Therefore, also in the present example, the crystallinity in the p-type base layer 34 can be prevented from lowering.

Figure 9:
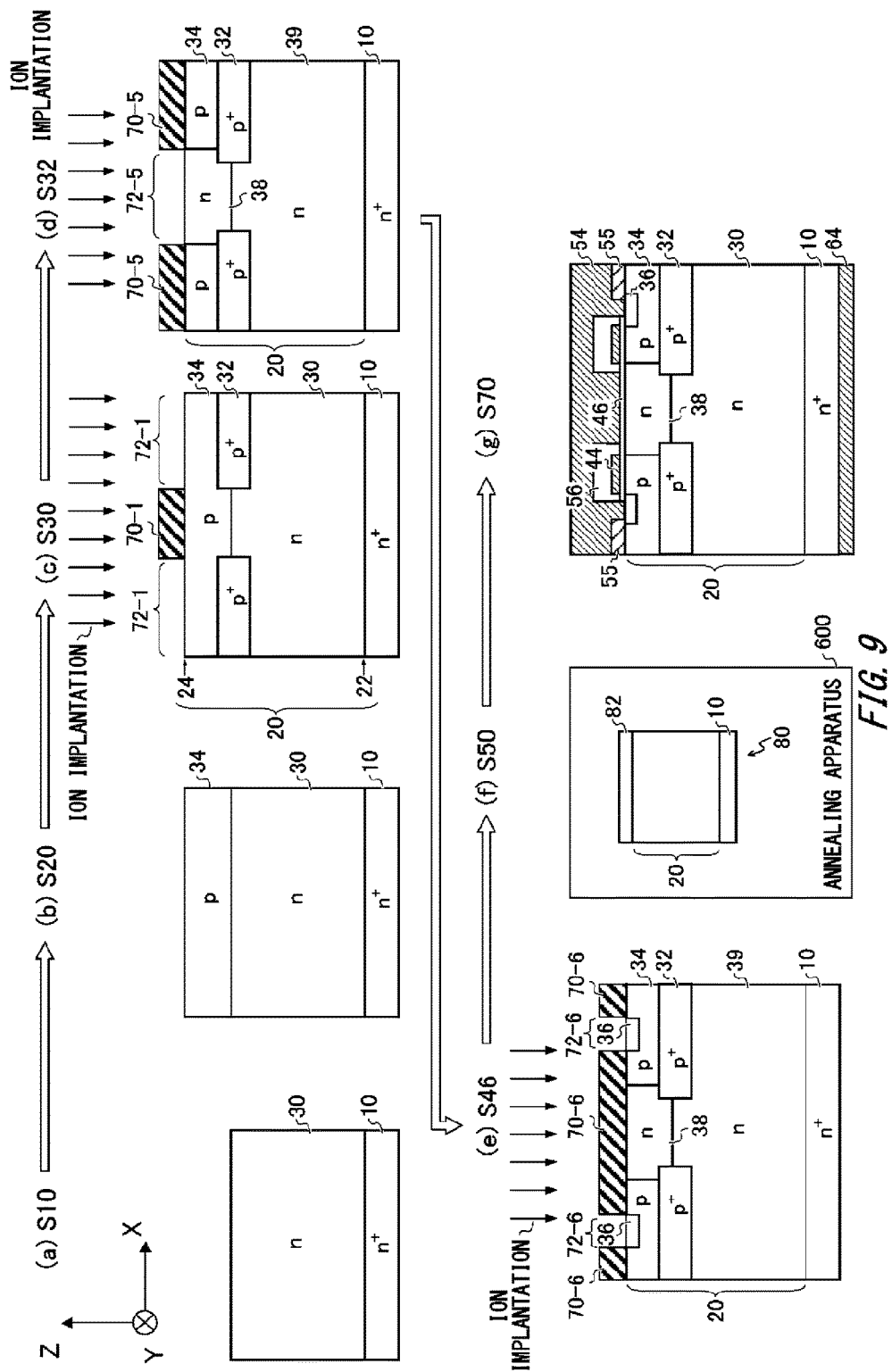
In FIG. 9, (a) through (g) are cross-sectional views showing respective steps of a manufacturing method of the vertical MOSFET device 300.

In FIG. 9, (a) through (g) are cross-sectional views showing respective steps of a manufacturing method of the vertical MOSFET device 300. Steps S10 through S30 in (a) through (c) of FIG. 9 are the same as steps S10 through S30 in (a) through (c) of FIG. 2, and therefore, overlapping explanation is omitted. Also in the present example, the respective steps are performed in the order of step S10 to S70 (that is, in the order from the smaller number).

In Step S32 in (d) of FIG. 9, n-type impurities are ion-implanted in order to form the n-type upper drift layer 38 from the uppermost surface of the p-type base layer 34 to a portion between a pair of the p⁺-type embedded regions 32. In step S32 of the present example, an opening 72-5 of a different pattern from that in step S30 is provided in a mask material 70-5. Then, n-type impurities are ion-implanted into the GaN layer 20 via the opening 72-5. At this time, the ion implantation is performed such that in the p-type base layer 34, the n-type impurity concentration becomes greater than the p-type impurity concentration. The impurities may also be ion-implanted in multiple steps. The n-type upper drift layer 38 has an effective concentration of electrons of, for example, $5E+17$ cm$^{-3}$.

The n-type upper drift layer 38 is formed by ion-implanting n-type impurities into the p-type base layer 34. Therefore, the n-type upper drift layer 38 includes the n-type impurities and the p-type impurities. In the present example, Si and Mg are used as the n-type impurities and the p-type impurities, so that the n-type upper drift layer 38 includes Si and Mg as the impurities. In contrast, as in the case of the p⁺-type embedded region 32, if the n-type upper drift layer 38 is formed by epitaxial growth, it includes only the n-type impurities as the impurities. Therefore, the case of forming the n-type upper drift layer 38 by ion implantation and the case of forming it by epitaxial growth can be clearly differentiated.

In step S46 in (e) of FIG. 9, as in step S40 in (d) of FIG. 2, n-type impurities are ion-implanted into part of the p-type base layer 34. However, in step S46, a mask material 70-6 having an opening 72-6 of a different pattern from that in step S40 is used. Because of this, the n-type impurities are ion-implanted into a position different from that in step S40. In step S46, the part of the p-type base layer 34 in which the n-type impurities are ion-implanted becomes the n⁺-type source region 36. In Step S46, the n-type impurities are ion-implanted into part of the p-type base layer 34, the part being different from the n-type upper drift layer 38. The ion implantation is performed such that the channel forming region 35 of the p-type base layer 34 is located between the n⁺-type source region 36 and the n-type upper drift layer 38 in the X direction. That is, the n⁺-type source region 36 of the present example is provided in a region different from a region immediately below the gate electrode 44.

Step S50 in (f) of FIG. 9 is the same as step S50 in (e) of FIG. 2, and therefore, overlapping explanation is omitted. Step S70 in (g) of FIG. 9 is almost the same as step S70 in (f) of FIG. 2. However, the present example differs in that the gate electrode 44 is provided above the p-type base layer 34. The present example is the same in the other regards.

Figure 10:
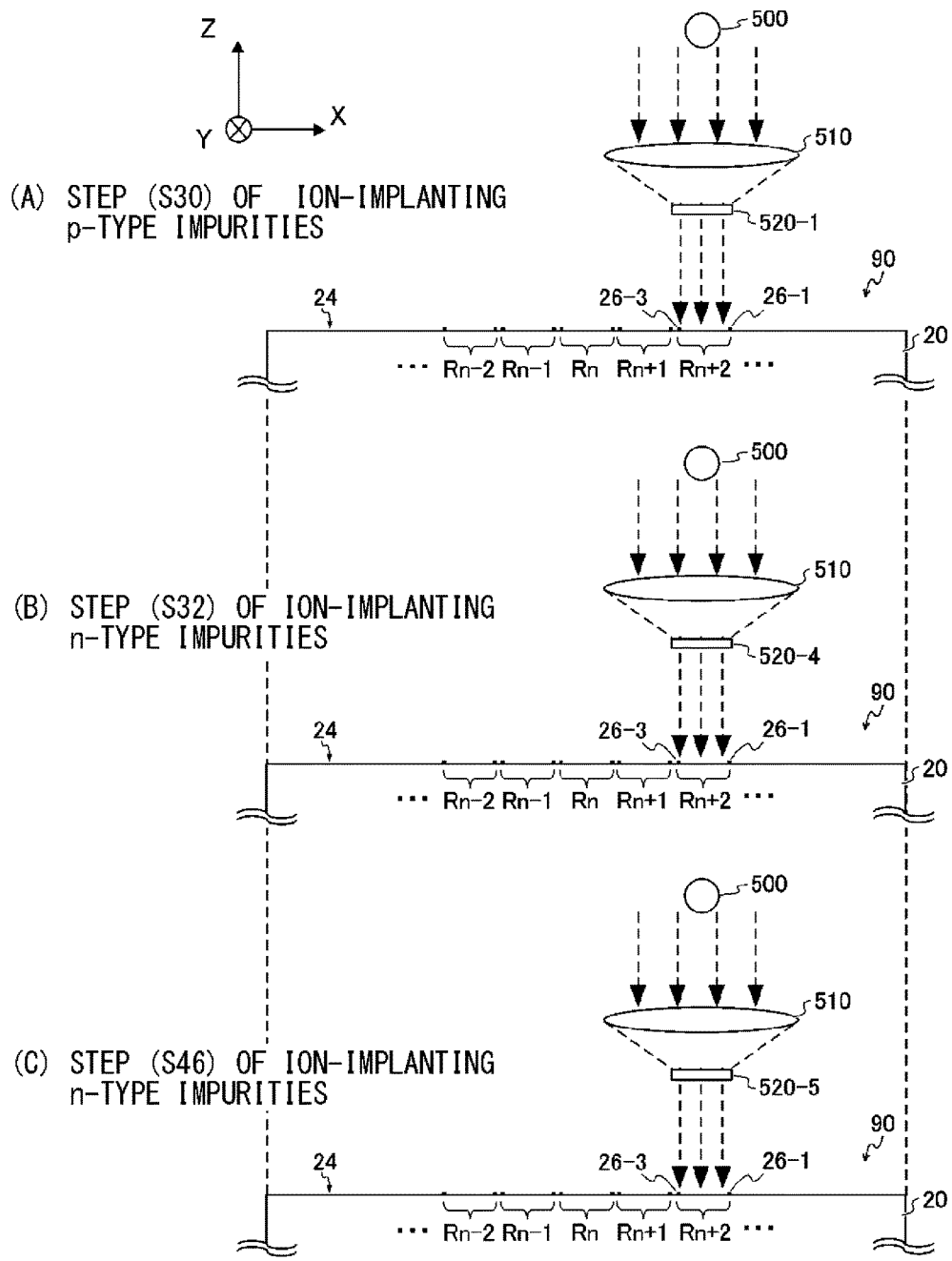
In FIG. 10, (A) through (C) are side views of the wafer 90 illustrating positions of the marks 26 in steps S30, S32, and S46.

In FIG. 10, (A) through (C) are respective side views of the wafer 90 illustrating positions of the marks 26 in step S30, S32, and S46. In FIG. 10, (A) corresponds to step (S30) of ion-implanting the p-type impurities in (c) of FIG. 9. In FIG. 10, (B) corresponds to step (S32) of ion-implanting the n-type impurities in (d) of FIG. 9. In FIG. 10, (C) corresponds to step (S46) of ion-implanting the n-type impurities in (e) of FIG. 9.

Also in the present example, the ion implantation is performed after the n-type drift layer 30 and the p-type base layer 34 are epitaxially grown. Therefore, also in step S30, S32, and S46, the front surface 24 continues being the uppermost surface of the wafer 90 (that is, GaN layer 20). Thus, the common mark 26 can be used in position alignment with the photomask 520-1 as the first photomask to be used in step S30, a photomask 520-4 as the third photomask to be used in step S32, and a photomask 520-5 to be used in step S46.

Figure 11:
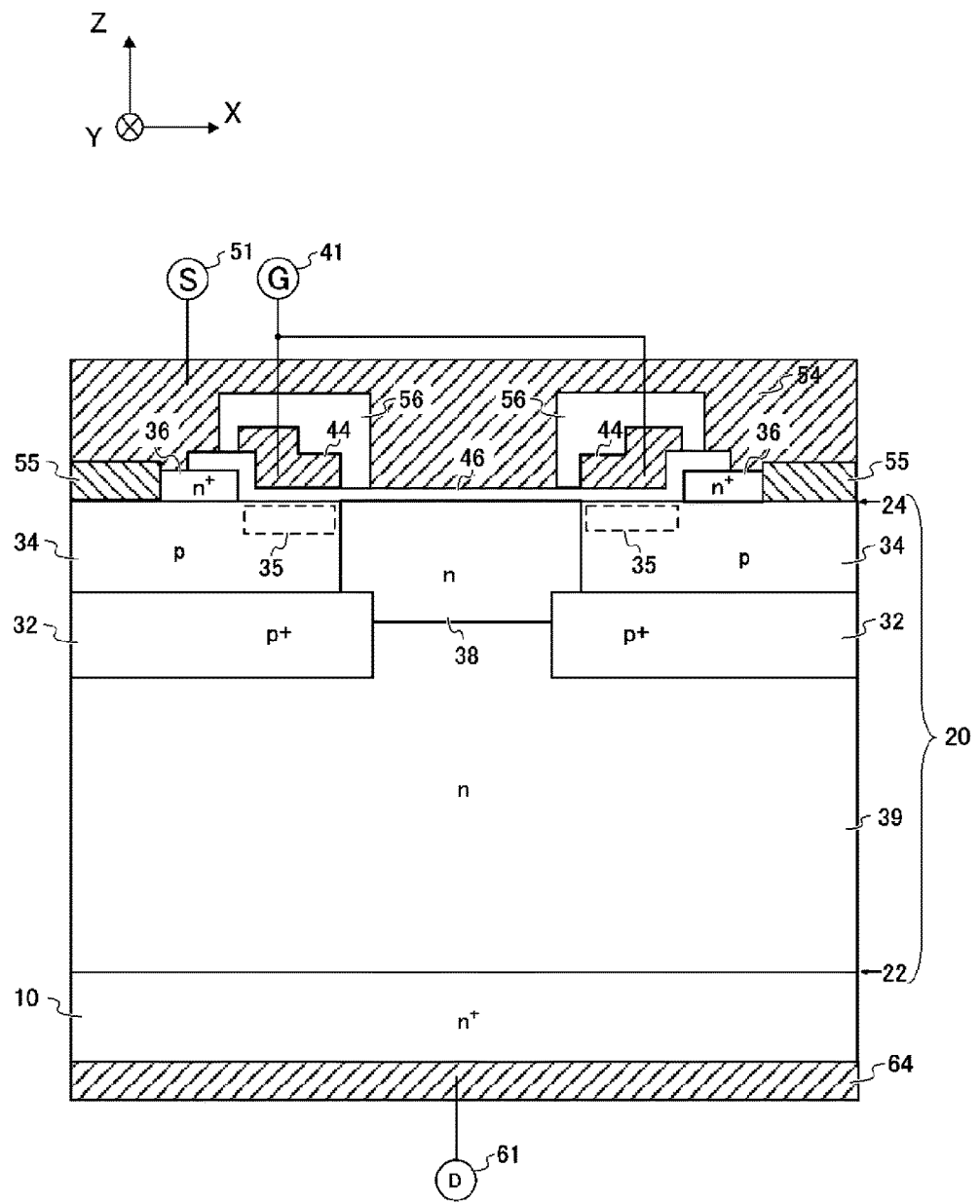
FIG. 11 is a cross-sectional view of a vertical MOSFET device 400 according to the fourth embodiment.

FIG. 11 is a cross-sectional view of a vertical MOSFET device 400 according to the fourth embodiment. In the present example, the n⁺-type source region 36 is epitaxially grown, and therefore, the n⁺-type source region 36 is provided to be adjacent to the gate electrode 44 in the X direction. The fourth embodiment is different from the third embodiment in this regard. It may be the same as the third embodiment in the other regards. Also in the present example, the crystallinity in the p-type base layer 34 can be prevented from lowering.

Figure 12:
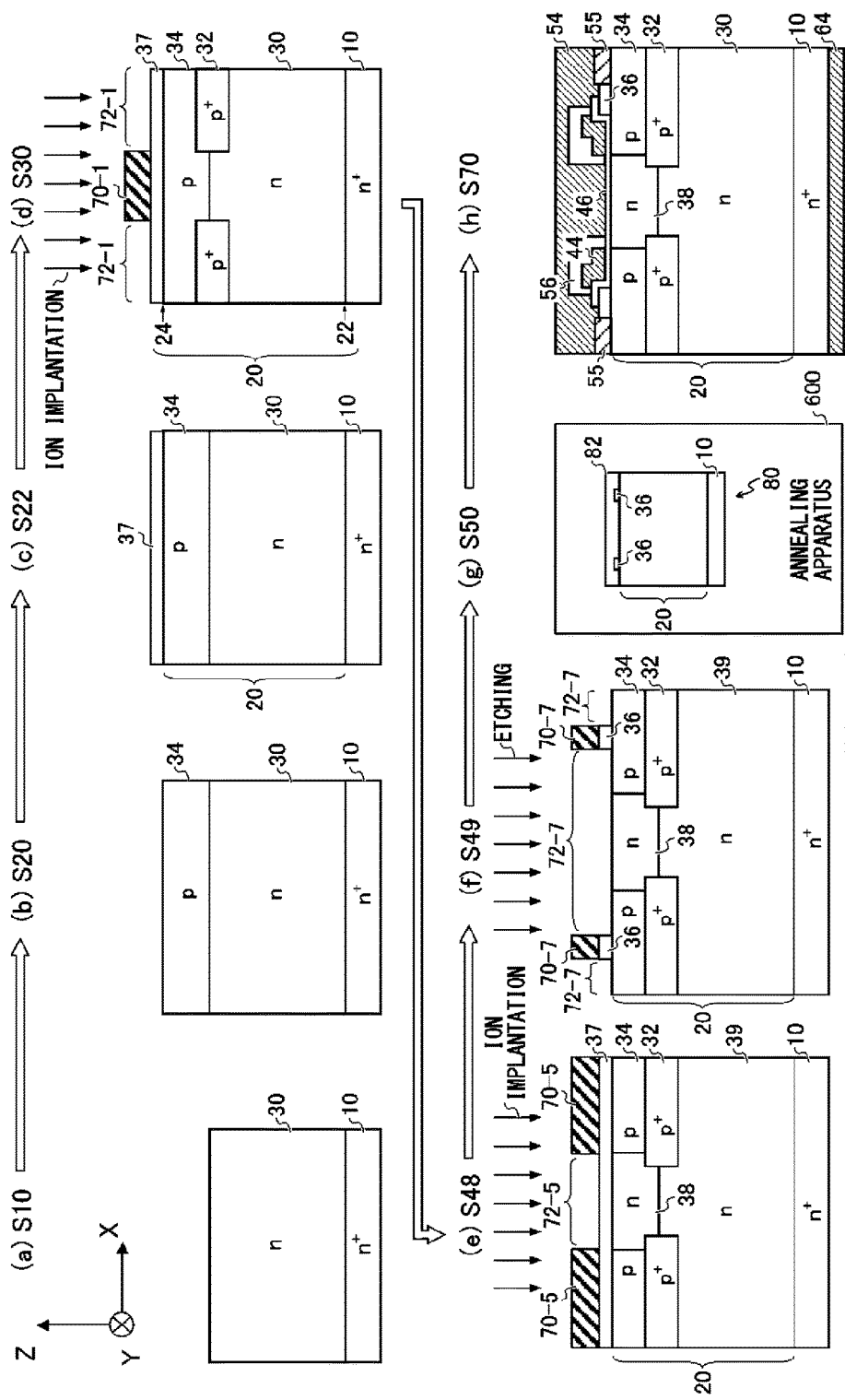
In FIG. 12, (a) through (h) are cross-sectional views showing respective steps of a manufacturing method of the vertical MOSFET device 400.

In FIG. 12, (a) through (h) are cross-sectional views showing respective steps of a manufacturing method of the vertical MOSFET device 400. Steps S10 through S30 in (a)

through (d) of FIG. 12 are the same as steps S10 through S30 in (a) through (d) of FIG. 7, and therefore, overlapping explanation is omitted. Also in the present example, the respective steps are performed in the order of step S10 to S70 (that is, in the order from the smaller number).

In step S48 in (e) of FIG. 12, as in (d) of FIG. 9, the n-type impurities are ion-implanted in order to form the n-type upper drift layer 38. However, in the present example, it is different from (d) of FIG. 9 in the third embodiment in that the n-type impurities are ion-implanted via the $n^+$-type source layer 37. Note that in (e) of FIG. 12, as in the third embodiment, the n-type drift layer 30 is referred to as the n-type lower drift layer 39.

In step S49 in (f) of FIG. 12, the $n^+$-type source layer 37 is etched to be selectively removed. In step S49, an opening 72-7 with a different pattern from that in step S48 is provided in a mask material 70-7. Then, the $n^+$-type source layer 37 below the opening 72-7 is removed by etching. Because of this, the $n^+$-type source layer 37 is removed selectively with respect to the GaN layer 20. Because of this, the $n^+$-type source region 36 is formed.

Step S50 in (g) of FIG. 12 is the same as step S50 in (f) of FIG. 9, and therefore, overlapping explanation is omitted. Step S70 in (h) of FIG. 12 is different from step S70 in (g) of FIG. 9 in that the gate electrode 44 is formed above and the gate insulating film 46 is formed on the $n^+$-type source region 36. However, it is the same in the other regards.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE NUMERALS

10: GaN substrate; 20: GaN layer; 22: back surface; 24: front surface; 26: mark; 30: n-type drift layer; 32: $p^+$-type embedded region; 34: p-type base layer; 35: channel forming region; 36: $n^+$-type source region; 37: $n^+$-type source layer; 38: n-type upper drift layer; 39: n-type lower drift layer; 40: trench portion; 41: gate terminal; 42: trench; 44: gate electrode; 46: gate insulating film; 51: source terminal; 54: source electrode; 55: body electrode; 56: interlayer insulating film; 61: drain terminal; 64: drain electrode; 70: mask material; 72: opening; 80: laminate; 82: cap layer; 90: wafer; 100, 200, 300, 400: vertical MOSFET device; 500: light source; 510: lens; 520: photomask; 530: position-aligning camera; 600: annealing apparatus

What is claimed is:

1. A vertical semiconductor device comprising:
    a gallium nitride-based semiconductor substrate;
    a gallium nitride-based n-type semiconductor layer provided on the semiconductor substrate;
    a gallium nitride-based p-type semiconductor layer that is provided on the n-type semiconductor layer and that includes no tail regions, a tail region being a region in which an impurity concentration of majority carriers in a depth direction gradually decreases; and
    a $p^+$-type embedded region that is provided selectively in a predetermined depth range across a boundary between the n-type semiconductor layer and the p-type semiconductor layer and that includes a region in which an impurity concentration of majority carriers in the depth direction gradually decreases.

2. The vertical semiconductor device according to claim 1, further comprising:
    a trench portion that reaches the n-type semiconductor layer located between a pair of the $p^+$-type embedded regions; and
    an $n^+$-type semiconductor region that is in part of the p-type semiconductor layer and is provided on both sides of the trench portion.

3. The vertical semiconductor device according to claim 1, further comprising:
    a trench portion that reaches the n-type semiconductor layer located between a pair of the $p^+$-type embedded regions; and
    an $n^+$-type semiconductor region that is on the p-type semiconductor layer and is provided on both sides of the trench portion.

4. The vertical semiconductor device according to claim 1, further comprising:
    a gate electrode provided above the p-type semiconductor layer; and
    an $n^+$-type semiconductor region that is in part of the p-type semiconductor layer and is provided in a region different from a region immediately below the gate electrode, wherein
    the p-type semiconductor layer has, in a region different from the $n^+$-type semiconductor region and different from the region immediately below the gate electrode, an n-type upper drift layer from an uppermost surface of the p-type semiconductor layer to a portion between a pair of the $p^+$-type embedded regions, and
    the n-type upper drift layer includes n-type impurities and p-type impurities.

5. The vertical semiconductor device according to claim 1, further comprising:
    a gate electrode provided above the p-type semiconductor layer; and
    an $n^+$-type semiconductor region that is on the p-type semiconductor layer and is provided adjacent to the gate electrode, wherein
    the p-type semiconductor layer has, in a region different from the $n^+$-type semiconductor region and a region immediately below the gate electrode, an n-type upper drift layer from an uppermost surface of the p-type semiconductor layer to a portion between a pair of the $p^+$-type embedded regions, and
    the n-type upper drift layer includes n-type impurities and p-type impurities.

6. The vertical semiconductor device according to claim 1, wherein
    in the region in which an impurity concentration of majority carriers in the depth direction gradually decreases, a depth-direction length required for the impurity concentration to be lowered by an order of magnitude is 50 nm or longer.

* * * * *